SIGNAL AMPLIFIER SYSTEM

Filed Sept. 5, 1957

INVENTOR.
GEORGE F. POPADUK
BY
Robert D. Sanborn
ATTORNEY

United States Patent Office 3,025,474

Patented Mar. 13, 1962

3,025,474

SIGNAL AMPLIFIER SYSTEM

George F. Popaduk, Bridgeport, Conn., assignor, by mesne assignments, to Philco Corporation, Philadelphia, Pa., a corporation of Delaware Filed Sept. 5, 1957, Ser. No. 682,568
13 Claims. (Cl. 330—160)

The present invention relates to signal amplifiers and more particularly to signal amplifiers having a zig-zag output signal versus input signal characteristic.

In the field of radar detection of moving targets the dynamic range of input signals to be processed greatly exceeds the limitations of linear intermediate frequency amplifiers and video processing equipment. In such a system the desired target signal may be superimposed on a very large ground clutter signal. This makes the use of logarithmic amplifiers impractical since the logarithmic characteristic would reduce the amplitude of the desired signal below the noise level.

Zig-zag amplifiers have been proposed for use in moving target indicating systems. One known form of zig-zag amplifier employs a plurality of cascaded amplifier detector stages. As each stage saturates it functions as a diode detector to convert the intermediate frequency signal to a video signal. Selected stages are arranged to function as grid detectors while other stages function as plate detectors to produce the desired zig-zag output characteristic. Amplifiers of this type suffer from the disadvantage that at least two cascaded stages are required to produce a zig-zag characteristic. A further disadvantage is that the grid detection characteristics and the plate detection characteristics of a saturated amplifier stage are dissimilar. This dissimilarity of the detection characteristics produces unwanted distortions in the over-all zig-zag characteristic. Also, in such systems detection takes place at different points along the cascaded amplifier circuit. Therefore it is necessary to employ a delay network in the output signal combining circuit to compensate for the transit time of signals through the later stages of the cascaded arrangement.

It is an object of the present invention to provide a circuit in which a zig-zag characteristic may be achieved in a single stage.

It is a further object of the invention to provide a zig-zag amplifier circuit which does not require detection of the signal to produce the desired characteristic.

Another object of the invention is to provide a circuit which may be cascaded without requiring delay or transit time compensating means in the output circuit.

Still another object of the invention is to provide a circuit in which the peaks of the zig-zag characteristic are relatively sharp.

These and other objects of the present invention are achieved by providing a stage which comprises a load impedance in series with an electrode controlled variable impedance circuit element. The electrode controlled circuit element may be a multigrid vacuum tube, a transistor having two or more control electrodes, or any equivalent device. Signals to be amplified are supplied to two separate control electrodes of this circuit element in such a way that the signal at one electrode tends to produce a signal having a first sense or phase and amplitude across said load impedance while the signal at the other electrodes tends to produce a signal of the opposite sense or phase and a different amplitude across said load impedance. The characteristics of the electrode controlled circuit element is such that one of said control electrodes reaches saturation level at a lower input signal amplitude than the other electrode.

For a better understanding of the present invention together with other and further objects thereof reference should now be made to the following detailed description which is to be read in conjunction with the accompanying drawing in which.

Figure 1:
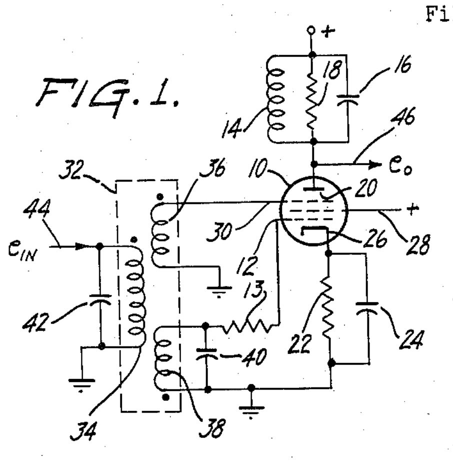
FIG. 1 is a schematic diagram of a preferred embodiment of the present invention.

In FIG. 1 tube 10 is a pentode amplifier tube which has the characteristic that the control action of control grid 12 limits sharply at the point which grid 12 starts to draw grid current. Preferably this limiting action is accomplished with a relatively small amount of grid current flow. A tube of the type 6BN6 or 6AS6 is suitable for this purpose. A resistor 13 may be included in series with the grid lead to improve the limiting action. A tuned anode load impedance comprising inductor 14, capacitor 16 and resistor 18 is connected between the source of anode supply potential represented by the plus sign (+) and the anode 20 of tube 10. A tuned anode load impedance is preferred for band-pass amplifiers such as amplifiers operating at intermediate frequencies. However, an untuned load impedance may be employed for amplifiers operating at audio or video frequencies. A self-biasing circuit comprising resistor 22 and capacitor 24 is connected between the cathode 26 and ground. The parallel combination of resistor 22 and capacitor 24 provides the necessary D.-C. bias potential between cathode 26 and control grid 12. The screen grid 28 of tube 10 is connected to a point of fixed bias potential schematically represented by the plus sign (+) in FIG. 1. Signals to be amplified are supplied to the control grid 12 and to the suppressor grid 30 of tube 10 by way of an input transformer 32 which has a single primary winding 34 and two secondary windings 36 and 38. One end of secondary winding 38 is connected to ground while the second end is connected to the control grid 12. A capacitor 40 tunes secondary winding 38 to the frequency of the incoming signal for band-pass operation of the amplifier stage. One terminal of secondary winding 36 is connected to ground and the other terminal of this winding is connected to the suppressor grid 30. Preferably winding 36 is untuned since primary winding 34 and secondary winding 38 are both tuned and triple tuned circuits are extremely difficult to adjust. However, a tuning capacitor may be added to this winding if desired. Windings 38 and 36 may be returned to a source of bias potential rather than ground if the characteristics of the tube 10 so require. The input signal is applied across winding 34. Again a capacitor 42 is provided for tuning the primary circuit to the frequency of the input signal. In FIG. 1, one terminal of winding 34 is shown connected to ground while the input signal is supplied to input lead 44 connected to the other terminal of winding 34. The grounding of one terminal of winding 34 is not essential to the operation of the invention but depends primarily on the connections of the circuits preceding the stage shown in FIG. 1.

The polarity of the several windings of transformer 32 is indicated in the conventional fashion by the solid dots placed adjacent one terminal of each of the transformer windings. As indicated by these polarity markings the input signal is supplied to the control grid 12 in one sense and to the suppressor grid 30 in the opposite sense. The transformation ratios between primary winding 34 and secondary winding 38 and primary winding 34 and secondary winding 36 are such that, for values below saturation level, control grid 12 exercises the greater control over the amplitude of the output signal than suppressor grid 30. The output signal of the amplifier stage of FIG. 1 is taken from the anode 20 of tube 10 by way of output connection 46.

Figure 2:
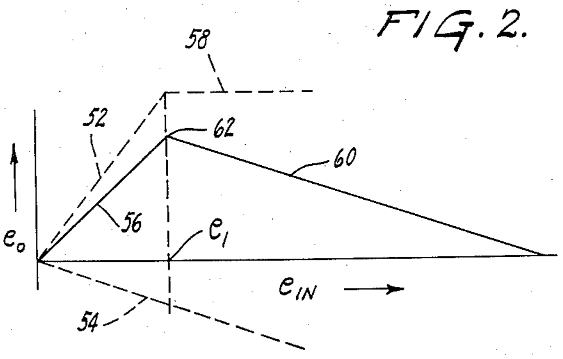
FIG. 2 is a characteristic curve of the circuit of FIG. 1.

FIG. 2 shows the output vs. input characteristic of the circuit of FIG. 1. Broken curve 52 of FIG. 2 illustrates the relationship between the output signal amplitude and the input signal amplitude for a varying potential supplied to control grid 12 and a constant potential on suppressor grid 30. The broken line 54 in FIG. 2 illustrates the relationship between the output signal at lead 46 and the input signal at lead 44 for a constant potential at control grid 12 but with a signal of variable amplitude supplied to suppressor grid 30. The negative amplitude of line 54 in FIG. 2 represents a phase inversion of the output signal. The net output signal appearing at lead 46 is as shown by the solid line 56 and is equal to the difference between curves 52 and 54. Amplitude $e_1$ of FIG. 2 is the level of input signal at which control grid 12 of FIG. 1 saturates. For amplitudes of the input signal below the value $e_1$ the output signal amplitude will be a linear function of input signal amplitude and will increase as the amplitude of the input signal increases. For amplitudes of input signal above the value $e_1$ the component of output signal appearing across the load impedance as a result of signal supplied to the control grid remains constant. This condition is represented by the horizontal line 58 in FIG. 2. Suppressor grid 30 is still unsaturated for values of input signal above level $e_1$. Therefore the component of the signal at anode 20 which results from variation in the suppressor grid potential will continue to increase in magnitude in a negative sense as the input signal amplitude increases above the value $e_1$. Therefore the net signal appearing at output lead 46 will be the difference between the constant value 58 and the value represented by curve 54. This difference is represented by the solid line 60 of FIG. 2. Therefore, as shown in FIG. 2, for progressively increasing values of input signal amplitude the amplitude of the output signal will first increase as represented by curve 56, reach a maximum value at 62 at a value of input signal $e_1$ and then decrease as the amplitude of the input signal increases above the value $e_1$. The amplitude of the output signal will decrease to zero or even become negative, that is reverse in phase, for large values of input signal amplitude provided saturation of the suppressor grid is not reached. For values of input signal above that value necessary to produce saturation of both the control grid 12 and the suppressor grid 30, the output signal of the circuit of FIG. 1 will remain constant regardless of changes in amplitude of the input signal. Therefore, as illustrated by FIG. 2, a zig-zag characteristic has been achieved in the single stage shown in FIG. 1. Furthermore this zig-zag characteristic has been achieved without resorting to detection of the input signal. The signal at output lead 46 is at the same frequency as the signal at input lead 44. The slopes of the two lines 56 and 60 of FIG. 2 will depend upon the turns ratio of the two secondary windings 36 and 38 and on the trans-conductances of the grids 12 and 30.

If linear operation of the tube is assumed, the anode current in tube 10 will be proportional to the product of the grid voltages. That is, $$i_p = K e_{g1} e_{g3}$$

where $i_p$ is the plate current in amperes, K is a constant, $e_{g1}$ represents the signal actually supplied to control grid 12 and $e_{g3}$ represents the signal actually suplied to suppressor grid 30. If $$e_{g1} = V_1 + A \sin \omega t$$

where $V_1$ is the D.-C. bias potential supplied to control grid 12 and A is a constant determined in part by the amplitude of the signal supplied to input lead 44 and in part by the transformation ratio of secondary winding 38 and primary winding 34, and if $$e_{g3} = V_3 + mA \sin (\omega t + \pi)$$

where $V_3$ is the D.-C. bias potential supplied to grid 30 and $m$ is a constant of proportionality determined by the relative turns ratios of secondary windings 36 and 38 then $$i_p = K(V_1 + A \sin \omega t)(V_3 + mA \sin \omega t + \pi)$$

but $$(V_3 + mA \sin \omega t + \pi) = (V_3 - mA \sin \omega t)$$

and therefore $$i_p = KV_1V_3 + KV_3A \sin \omega t - KV_1mA \sin \omega t - KmA^2 \sin^2 \omega t$$

the term $KV_1V_3$ is a D.-C. component which may be eliminated by a suitable blocking capacitor. The final term $KmA^2 \sin^2 \omega t$ contains a D.-C. component which can be eliminated by a blocking capacitor, and a second harmonic component which will be rejected by the tuned load impedance. If an untuned load impedance is employed, a suitable tuned filter circuit may be provided in series with the output lead 46 for blocking this second harmonic component.

The useful component of the output signal becomes:

$$KV_3A \sin \omega t - KV_1mA \sin \omega t$$

It will be seen that this equation describes the curve 56—60 of FIG. 2 if saturation of the control grid effect is assumed at input signal amplitude $e_1$. In order to prevent loss of input signals occurring at the peaks of the zig-zag, the transition from line 56 to line 60 should be as sharp as possible. Since the embodiment of FIG. 1 does not rely on the detection characteristics of the grid circuit the transition is much sharper for the embodiment of FIG. 1 than for prior art forms of zig-zag amplifiers. Electron tubes of the type designated 6BN6 are ideally suited for intermediate frequency amplifiers of the type shown because of the sharp limiting characteristic on both the control grid and the suppressor grid. This type of electron tube has the further highly desirable characteristic that it draws relatively low grid current for input signal amplitudes above the saturation level. The low value of grid current minimizes the detuning of the input transformer.

Figure 3:
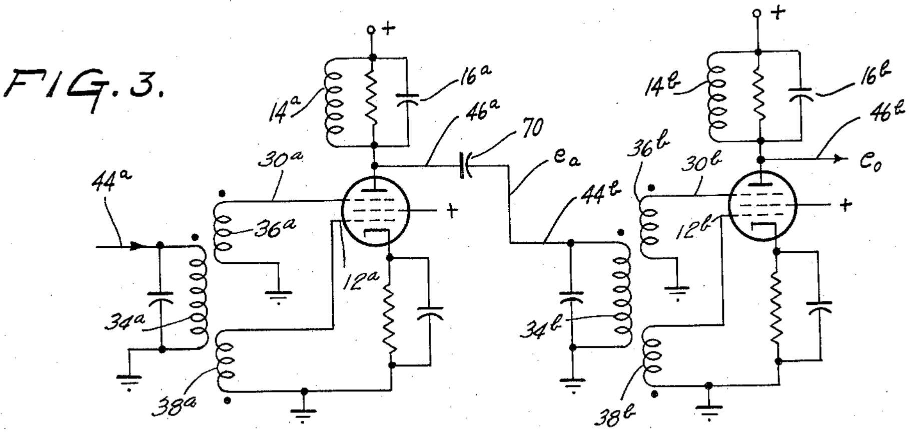
FIG. 3 is a schematic diagram of a second embodiment of the present invention.

The circuit of FIG. 3 comprises two of the stages of FIG. 2 connected in cascade. Parts in the first stage corresponding to like parts in the circuit of FIG. 1 have been given the same reference numeral with the added superscript *a*. Similarly, parts in the second stage corresponding to like parts in the stage of FIG. 1 have been given the same reference numeral with the superscript *b*. As shown in FIG. 3 a capacitor 70 connects output lead $46^a$ to input lead $44^b$ of the second stage. It is to be understood however that other forms of interstage coupling may be substituted if desired.

Figure 4:
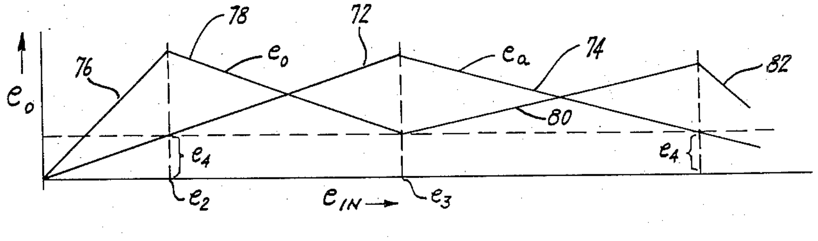
FIGS. 4 and 5 are characteristic curves of the embodiment of FIG. 3.

FIG. 4 is an output signal amplitude vs. input signal amplitude characteristic for the circuit of FIG. 3 for the condition that saturation of control grid $12^b$ is reached at input signal amplitude $e_2$ and the saturation level of control grid $12^a$ is reached at a signal amplitude at input lead $44^a$ equal to $e_3$ of FIG. 4. As shown in FIG. 4, the signal at the output lead $46^a$ of the first stage increases linearly along line 72 with increasing amplitude of the input signal until the amplitude $e_3$ is reached. As the input signal is increased in amplitude above amplitude $e_3$, the amplitude of the output signal will decrease as shown by line 74. The signal $e_a$ of FIG. 4 which is the output signal of the first stage is supplied to the input lead $44^b$ of the second stage. The characteristics of the second stage are such that the control grid $12^b$ of the second stage saturates when the output signal level of the first stage is equal to $e_4$. A signal at the output lead $46^a$ which has an amplitude $e_4$ will be produced by an input signal on lead $44^a$ which has an amplitude $e_2$. It is this amplified signal $e_4$ which is supplied to the input lead $44^b$ of the second stage. For input signal amplitudes on lead $44^a$ greater than zero but less than $e_2$ the output signal of the cascaded stages at output lead $46^b$ increases linearly as shown by line 76. For amplitudes of the input signal greater than $e_2$ the larger output signal from the first stage on lead $46^a$ will cause the amplitude of the signal on lead $46^b$ to decrease along the line 78. When the input signal potential on lead $44^a$ reaches an amplitude $e_3$ saturation of the control grid $12^a$ occurs and the output of the first stage starts to decrease with increasing signal amplitude. The decreasing amplitude of the signal at the output of the first stage, lead $46^a$, causes the output of the second stage, lead $46^b$, to again increase as shown by line 80. If the slopes of lines 72 and 74 are equal, the slopes of lines 78 and 80 will be equal and the over-all characteristic curve of the two cascaded stages will be symmetrical about the value $e_3$. If the output of the first stage again falls to a value $e_4$, the control grid $12^b$ of the second stage will no longer be saturated and the signal supplied to the control grid will again have an effect on the amplitude of the output signal. If the increased amplitude of the input signal on lead $44^a$ causes the amplitude of the signal from the first stage to fall below the value $e_4$, the output of the final stage will again decrease along the line 82. Line 82 corresponds to line 76 traced in the reverse direction.

Figure 5:
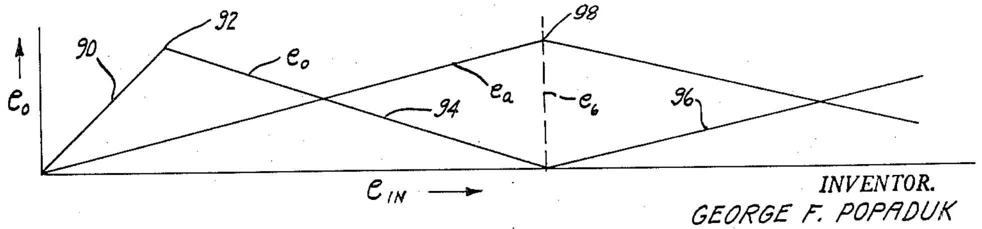

FIG. 5 is a characteristic for a circuit of the type shown in FIG. 3 wherein the saturation level $e_6$ of the grid $12^a$ of the first stage is selected to be equal to the value of input signal amplitude on lead $44^a$ which will just reduce the output level of the second stage to zero. The signal at input lead $44^b$ to the second stage for an input signal of amplitude $e_6$ on input lead $44^a$ of the first stage will be the peak value 98 of the output voltage $e_a$ of the first stage. If this condition is met the output signal of the two cascaded stages will initially rise along line 90, reach a maximum value at point 92 where grid $12^b$ saturates, again decrease to zero along line 94 as the component of the output signal resulting from the signal on grid $30^b$ increases and then increase again along line 96 due to the decrease in the amplitude of the output signal of the first stage which occurs as a result of saturation of grid $12^a$. The output signal will have the maximum possible dynamic range within the limits of the zig-zag amplifier system without phase reversal if the output of the final stage decreases to zero before it increases again. In some instances the component of the output signal resulting from the signal on the suppressor grid $30^b$ may exceed the component of the output signal resulting from the signal on control grid $12^b$. In this case line 94 will cross zero, representing a phase reversal in the output signal. In a system which is responsive to the phase as well as the amplitude of the output signal the maximum possible dynamic range is achieved when the saturation level for grid $12^a$ of the first stage is made equal to the saturation level of the grid $30^b$ of the second stage.

It should be noted that the entire output signal appears at output lead $46^b$ of the final stage. Therefore there is no need to provide the signal combining circuits and delay compensating means which are necessary in prior art forms of zig-zag amplifier systems.

The two embodiments illustrated in the drawing employ pentode amplifier tubes. However, it is to be understood that other forms of electron tubes have two suitable control elements which may be employed as well. It should be understood also that transistors or combinations of transistors having two or more control electrodes may be substituted for the electron tubes of FIGS. 1 and 3. The input transformer of the present invention may be replaced by some other form of phase splitter. However the transformer is preferred because of its simplicity.

While the invention has been described with reference to the preferred embodiments thereof, it will be apparent that various modifications and other embodiments thereof will occur to those skilled in the art within the scope of the invention. Accordingly I desire the scope of my invention to be limited only by the appended claims.

What is claimed is:

1. An amplifier for alternating current signals of frequency $f_1$, said amplifier including a stage comprising an electrode controlled variable impedance circuit element, said circuit element including at least first and second control electrodes, a load impedance connected in series with said circuit element, said circuit element being further characterized by relatively abrupt modification of the control effect of said control electrodes at the regions of saturation and cutoff, respectively, means for impressing a potential difference across said series combination, first signal coupling means for supplying the alternating current signal to be amplified to said first control electrode, second signal coupling means for supplying said alternating current signal to be amplified to said second control electrode in time coincidence with the signal supplied to said first control electrode, said first signal coupling means having a signal transfer characteristic ratio $t_1$, said second signal coupling means having a signal transfer characteristic ratio $t_2$, where $t_1$ and $t_2$ are related as follows $$t_1a_1 = -kt_2a_2$$

and $$\frac{e_{s2}}{t_2} = c\frac{e_{s1}}{t_1}$$

where $a_1$ is the unsaturated signal transfer characteristic ratio at frequency $f_1$ from said first control electrode to said load impedance, $a_2$ is the unsaturated signal transfer characteristic ratio at frequency $f_1$ from said second control electrode to said load impedance, $k$ is an arbitrary, positive constant having a value greater than unity, $e_{s2}$ is the amplitude of the signal at said second control electrode which will produce saturation of the control effect of said second control electrode, $e_{s1}$ is the amplitude of the signal at said first control electrode which will produce saturation of the control effect of said first control electrode and $c$ is an arbitrary constant.

2. An amplifier stage as in claim 1 wherein said constant $c$ has a value greater than unity.

3. An amplifier stage as in claim 1 wherein said load impedance is resonant at frequency $f_1$.

4. An amplifier comprising an electron tube having at least an anode, a cathode, a first grid and a second grid, said electron tube being further characterized by relatively abrupt modification of the control effects of said grids at the regions of cutoff and saturation, respectively, a load impedance connected in series with the anode-cathode circuit of said electron tube, means for connecting a source of anode potential across said series circuit, first signal coupling means for supplying a signal to be amplified to said first grid, second signal coupling means for supplying said signal to be amplified to said second grid, said signal supplied to said first grid being inverted with respect to said signals supplied to said second grid, said first and second coupling means being related by the following expressions $$t_1g_1 \text{ is greater than } t_2g_2$$

and $$\frac{e_{s2}}{t_2} = c\frac{e_{s1}}{t_1}$$

where $t_1$ is the signal transfer characteristic ratio of said first signal coupling means, $t_2$ is the signal transfer characteristic ratio of said second signal coupling means, $g_1$ is the signal transfer characteristic ratio from said first grid to said anode, $g_2$ is the signal transfer characteristic ratio from said second grid to said anode, $e_{s2}$ is the amplitude of the signal to be amplified, measured at said second grid, which will produce saturation of the control effect of said second grid, $e_{s1}$ is the amplitude of the signal to be amplified, measured at said first grid, which will produce saturation of the control effect of said first grid and $c$ is an arbitrary constant.

5. An amplifier stage as in claim 4 wherein said load impedance is resonant at the frequency of the signal to be amplified.

6. An amplifier stage as in claim 4 wherein said constant $c$ has a value greater than unity.

7. An amplifier comprising two cascaded stages, each of said stages comprising an electron controlled variable impedance circuit element, said circuit element including at least first and second control electrodes, said circuit element being characterized by relatively abrupt modification of the control effects of said control electrodes at the regions of cutoff and saturation, respectively, a load impedance connected in series with said circuit element, said load impedance being resonant at the frequency of the signal to be amplified, means for impressing a potential difference across said series combination, first signal coupling means for supplying an input signal to said first control electrode, second signal coupling means for supplying said input signal to said second control electrodes in time coincidence with the signal supplied to said first control electrode, said first signal coupling means having a signal transfer characteristic ratio $t_1$, said second signal coupling means having a signal transfer characteristic ratio $t_2$, where $t_1$ and $t_2$ are related as follows $$t_1a_1=-kt_2a_2$$

and $$\frac{e_{s2}}{t_2}=c\frac{e_{s1}}{t_1}$$

where $a_1$ is the unsaturated signal transfer characteristic ratio at the frequency of the signal to be amplified from said first control electrode to said load impedance, $a_2$ is the unsaturated signal transfer characteristic ratio at the frequency of the signal to be amplified from said second control electrode to said load impedance, $k$ is an arbitrary, positive constant having a value greater than unity, $e_{s2}$ is the amplitude of the signal to be amplified measured at said second control electrode which will produce saturation of the control effect of said second control electrode, $e_{s1}$ is the amplitude of the signal to be amplified measured at said first control electrode which will produce saturation of the control effect of said first control electrode and $c$ is a constant, means coupling said first and second signal coupling means in the final one of said two stages to said load impedance of the preceding stage, and means for supplying the signal to be amplified to said first and second signal coupling means of said preceding stage.

8. An amplifier in accordance with claim 7 wherein the saturation level for said second electrode of said final stage is reached at approximately the same amplitude of the signal to be amplified as the saturation level for said first electrode of said preceding stage.

9. An amplifier in accordance with claim 7 wherein the output signal of said final stage reaches zero amplitude at approximately the amplitude of the signal to be amplified which results in the saturation of said control effect for said first electrode of said preceding stage.

10. An intermediate frequency amplifier which includes a stage comprising an electron tube having at least an anode, a cathode, a control grid and a suppressor grid, said electron tube being characterized by relatively abrupt modification of the control effect of said grids at the regions of cutoff and saturation, respectively, a tuned load impedance and a source of anode supply potential connected in the anode-cathode circuit of said electron tube, an input transformer having a primary winding to which a signal to be amplified may be supplied, a first secondary winding having the respective ends thereof coupled to said cathode and said control grid and a second secondary winding having the respective ends thereof coupled to said cathode and said suppressor grid, said secondary windings being oppositely poled whereby said suppressor grid and said control grid tend to produce oppositely directed changes in the anode current of said tube for the same signal supplied to said primary winding, the transformation ratios of said input transformer being related as follows:

$$t_1a_1 \text{ is greater than } t_2a_2$$

and $$\frac{e_{s2}}{t_2}=c\frac{e_{s1}}{t_1}$$

where $t_1$ is the transformation ratio from said primary winding to said first secondary winding, $t_2$ is the transformation ratio from said primary winding to said second secondary winding, $a_1$ is the signal transfer characteristic ratio of said tube from said control grid to said anode, $a_2$ is the signal transfer characteristic ratio of said tube from said suppressor grid to said anode, $e_{s1}$ is the amplitude of the signal at said control grid which will cause saturation of the control effect of said control grid, $e_{s2}$ is the signal amplitude at said suppressor grid which will cause saturation of the control effect of said suppressor grid and $c$ is an arbitrary constant having a value greater than unity.

11. An intermediate frequency amplifier in accordance with claim 10, said amplifier including a second amplifier stage of the type recited, means coupling said primary winding of said second stage to said load impedance of the first stage and means for supplying the signal to be amplified to the primary winding of said first stage.

12. An amplifier in accordance with claim 11 wherein the control grid of said preceding stage saturates at approximately the same amplitude of signal to said preceding stage as produces saturation of said suppressor grid in said final stage.

13. An amplifier in accordance with claim 11 wherein the output signal of said second stage reaches zero at approximately the amplitude of the signal to said first stage which results in the saturation of the control effect of said control grid of said first stage.

References Cited in the file of this patent

UNITED STATES PATENTS

| | | |
|---|---|---|
| 2,279,058 | Reid | Apr. 7, 1942 |
| 2,475,132 | Ergen | July 5, 1949 |
| 2,480,201 | Selove | Aug. 30, 1949 |
| 2,679,002 | White | May 18, 1954 |
| 2,819,017 | Palmer | Jan. 7, 1958 |
| 2,891,152 | Altes | June 16, 1959 |

OTHER REFERENCES

Geppert: "Basic Electron Tubes," McGraw Hill, 1951, pages 137–139.

Radio World, May 14, 1932, pages 6–8.